(12) United States Patent
Okabe et al.

(10) Patent No.: US 11,545,541 B2
(45) Date of Patent: Jan. 3, 2023

(54) DISPLAY DEVICE INCLUDING LIGHT EMITTING ELEMENT INCLUDING REFLECTION ELECTRODE ON WHICH MULTIPLE METALLIC CONDUCTIVE LAYERS ARE STACKED AND METHOD FOR MANUFACTURING SAME

(71) Applicant: Sharp Kabushiki Kaisha, Sakai (JP)

(72) Inventors: Tohru Okabe, Sakai (JP); Ryosuke Gunji, Sakai (JP); Hiroki Taniyama, Sakai (JP); Shinsuke Saida, Sakai (JP); Hiroharu Jinmura, Sakai (JP); Yoshihiro Nakada, Sakai (JP); Akira Inoue, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 37 days.

(21) Appl. No.: 16/464,333

(22) PCT Filed: Sep. 28, 2017

(86) PCT No.: PCT/JP2017/035250
§ 371 (c)(1),
(2) Date: May 28, 2019

(87) PCT Pub. No.: WO2019/064437
PCT Pub. Date: Apr. 4, 2019

(65) Prior Publication Data
US 2020/0388668 A1 Dec. 10, 2020

(51) Int. Cl.
*H01L 27/32* (2006.01)
*H01L 51/52* (2006.01)
*H01L 51/56* (2006.01)

(52) U.S. Cl.
CPC ...... *H01L 27/3279* (2013.01); *H01L 51/5218* (2013.01); *H01L 51/56* (2013.01); *H01L 2227/323* (2013.01)

(58) Field of Classification Search
CPC . H01L 27/3279; H01L 51/5218; H01L 51/56; H01L 2227/323
(Continued)

(56) References Cited

U.S. PATENT DOCUMENTS

2005/0045882 A1* 3/2005 Park .................. H01L 27/1248
257/59
2006/0043360 A1* 3/2006 Kim .................. H01L 27/3276
257/40

(Continued)

FOREIGN PATENT DOCUMENTS

JP 2004-103247 A 4/2004
JP 2004-247106 A 9/2004

(Continued)

OTHER PUBLICATIONS

Official Communication issued in International Patent Application No. PCT/JP2017/035250, dated Dec. 26, 2017.

*Primary Examiner* — Thao X Le
*Assistant Examiner* — Eric W Jones
(74) *Attorney, Agent, or Firm* — Keating & Bennett, LLP

(57) ABSTRACT

A wiring line is provided on a TFT layer, in which the wiring line is formed in the same layer and formed of the same material as those of a reflection electrode. The reflection electrode includes a plurality of metallic conductive layers made up of a low resistance metallic material, an oxide-based lower transparent conductive layer provided on a lower surface side of a lowermost metallic conductive layer constituting a lowermost layer, an oxide-based upper transparent conductive layer having light reflectivity and provided on an upper surface side of an uppermost metallic (Continued)

conductive layer constituting an uppermost layer, and an oxide-based intermediate transparent conductive layer provided between the plurality of metallic conductive layers.

17 Claims, 9 Drawing Sheets

(58) Field of Classification Search
USPC .................................................. 257/40, 59
See application file for complete search history.

(56) References Cited

U.S. PATENT DOCUMENTS

| | | | | |
|---|---|---|---|---|
| 2007/0103063 A1* | 5/2007 | Kim | ............... | H01L 27/3244 313/504 |
| 2008/0121886 A1* | 5/2008 | Shin | ............... | H01L 27/3276 257/59 |
| 2009/0045733 A1* | 2/2009 | Suh | ............... | H01L 27/3276 313/504 |
| 2010/0007272 A1* | 1/2010 | Toyoda | ............... | H01L 51/5203 313/504 |
| 2010/0059754 A1* | 3/2010 | Lee | ............... | H01L 51/5275 257/59 |
| 2010/0309101 A1* | 12/2010 | Kanegae | ............... | H01L 51/529 345/76 |
| 2012/0091459 A1 | 4/2012 | Choi et al. | | |
| 2012/0168755 A1* | 7/2012 | Choi | ............... | H01L 51/5215 257/59 |
| 2012/0205671 A1* | 8/2012 | Yamazaki | ............... | H01L 27/124 257/79 |
| 2012/0248465 A1 | 10/2012 | Choi et al. | | |
| 2013/0049062 A1* | 2/2013 | Hatano | ............... | H01L 51/5246 257/99 |
| 2014/0159002 A1* | 6/2014 | Lee | ............... | H01L 51/5256 257/40 |
| 2015/0001500 A1* | 1/2015 | Sung | ............... | H01L 27/3244 257/40 |
| 2015/0060809 A1* | 3/2015 | Kim | ............... | H01L 27/3246 257/40 |
| 2015/0123093 A1* | 5/2015 | Reusch | ............... | H01L 51/5275 257/40 |
| 2016/0118625 A1 | 4/2016 | Uesaka et al. | | |
| 2016/0141548 A1* | 5/2016 | Tanaka | ............... | H01L 51/5246 257/40 |
| 2016/0163985 A1 | 6/2016 | Yokota et al. | | |
| 2016/0372497 A1* | 12/2016 | Lee | ............... | G02F 1/136213 |
| 2017/0077447 A1* | 3/2017 | Kang | ............... | H01L 27/3246 |
| 2017/0125505 A1* | 5/2017 | Oh | ............... | H01L 51/52 |
| 2017/0221923 A1 | 8/2017 | Kanda | | |
| 2017/0279071 A1* | 9/2017 | Tam | ............... | H01L 27/3244 |

FOREIGN PATENT DOCUMENTS

| | | |
|---|---|---|
| JP | 2015-079739 A | 4/2015 |
| JP | 2016-085970 A | 5/2016 |
| JP | 2016-110904 A | 6/2016 |
| JP | 2017-092439 A | 5/2017 |
| JP | 2017-139092 A | 8/2017 |

* cited by examiner

_(12) United States Patent_ US 11,545,541 B2

DISPLAY DEVICE INCLUDING LIGHT EMITTING ELEMENT INCLUDING REFLECTION ELECTRODE ON WHICH MULTIPLE METALLIC CONDUCTIVE LAYERS ARE STACKED AND METHOD FOR MANUFACTURING SAME

TECHNICAL FIELD

The disclosure relates to a display device and a method for manufacturing the same.

BACKGROUND ART

In recent years, organic EL display devices, which use organic electroluminescence (EL) elements and are of the self-luminous type, have attracted attention as a display device which may replace the liquid crystal display device. Here, the organic EL element includes, for example, an organic EL layer including a light emitting layer, a first electrode provided on a surface side of the organic EL element as a reflection electrode, and a second electrode provided on the other surface side of the organic EL element.

For example, PTL 1 discloses an organic EL reflection electrode film made up of a layered film of an indium tin oxide (ITO) film/an Ag alloy film/an ITO film.

CITATION LIST

Patent Literature

PTL 1: JP 2015-79739 A

SUMMARY

Technical Problem

Incidentally, in the organic EL display device disclosed in PTL 1 above in which the first electrode is formed by the organic EL reflection electrode film, for example, when a wiring line made up of an ITO layer/Ag alloy layer/ITO layer is formed by an organic EL reflection electrode in which an Ag alloy film is made thicker to obtain a low resistance, an end face of the Ag alloy layer comes to shift inwards of end faces of the upper and lower ITO layers. As this occurs, there are fears that a wire width of the wiring line gets thinner than a design value or an end portion of the upper ITO layer which projects like a pent roof is peeled.

The disclosure has been made in view of the problem described above, and an object thereof is to form a low resistance wiring line in which an end face of an intermediate layer is prevented from shifting inwards.

Solution to Problem

To achieve the object, according to the disclosure, there is provided a display device including a base substrate, a TFT layer provided on the base substrate, and a light emitting element provided on the TFT layer and including a reflection electrode, wherein the reflection electrode includes a plurality of metallic conductive layers formed of a low resistance metallic material, an oxide-based lower transparent conductive layer provided on a lower surface side of a lowermost metallic conductive layer constituting a lowermost layer of the plurality of metallic conductive layers, an oxide-based upper transparent conductive layer provided on an upper surface side of an uppermost metallic conductive layer constituting an uppermost layer of the plurality of metallic conductive layers, and an oxide-based intermediate transparent conductive layer provided between the plurality of metallic conductive layers, wherein the uppermost metallic conductive layer includes light reflectivity, and wherein a wiring line is provided on the TFT layer, the wiring line being formed of the same material as a material of the reflection electrode.

Advantageous Effects of Disclosure

According to the disclosure, the reflection electrode includes the plurality of metallic conductive layers made up of the low resistance metallic material, the oxide-based lower transparent conductive layer provided on the lower surface side of the lowermost metallic conductive layer constituting the lowermost layer, the oxide-based upper transparent conductive layer having the light reflectivity and provided on the upper surface side of the uppermost metallic conductive layer constituting the uppermost layer, and the oxide-based intermediate transparent conductive layer provided between the plurality of metallic conductive layers, in which the wiring line is formed in the same layer and of the same material as those of the reflection electrode and is provided on the TFT layer. Hence, the wiring line may be formed which has the low resistance and in which the end face of the intermediate layer is prevented from shifting inward.

DESCRIPTION OF EMBODIMENTS

Embodiments of the disclosure will be described below in detail with reference to the drawings. The disclosure is not limited to the embodiments described below.

First Embodiment

Figure 1:
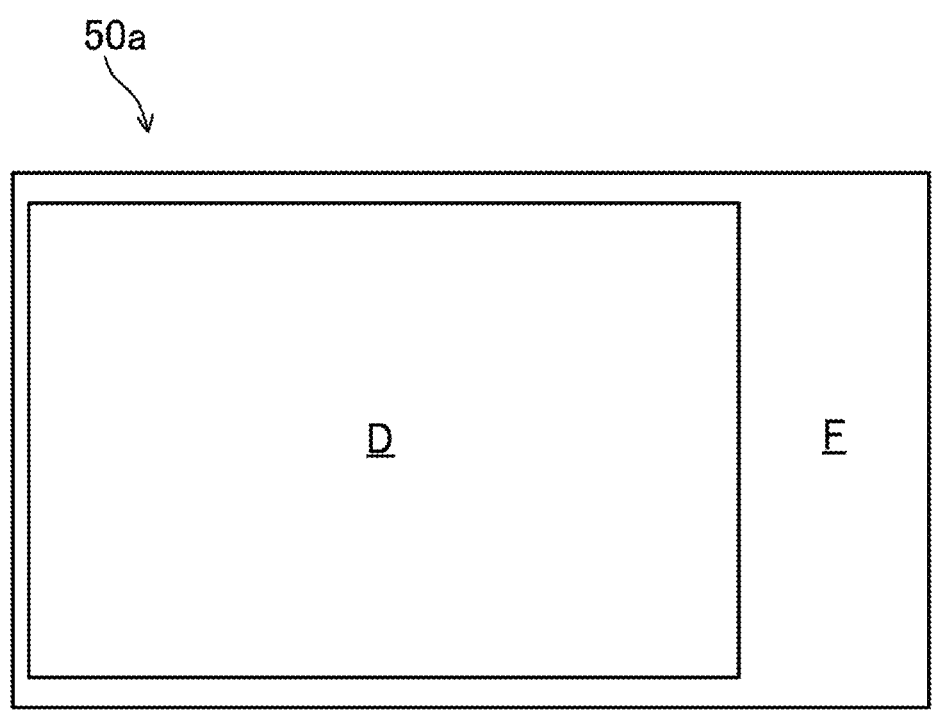
FIG. 1 is a plan view of an organic EL display device according to a first embodiment of the disclosure.
Figure 2:
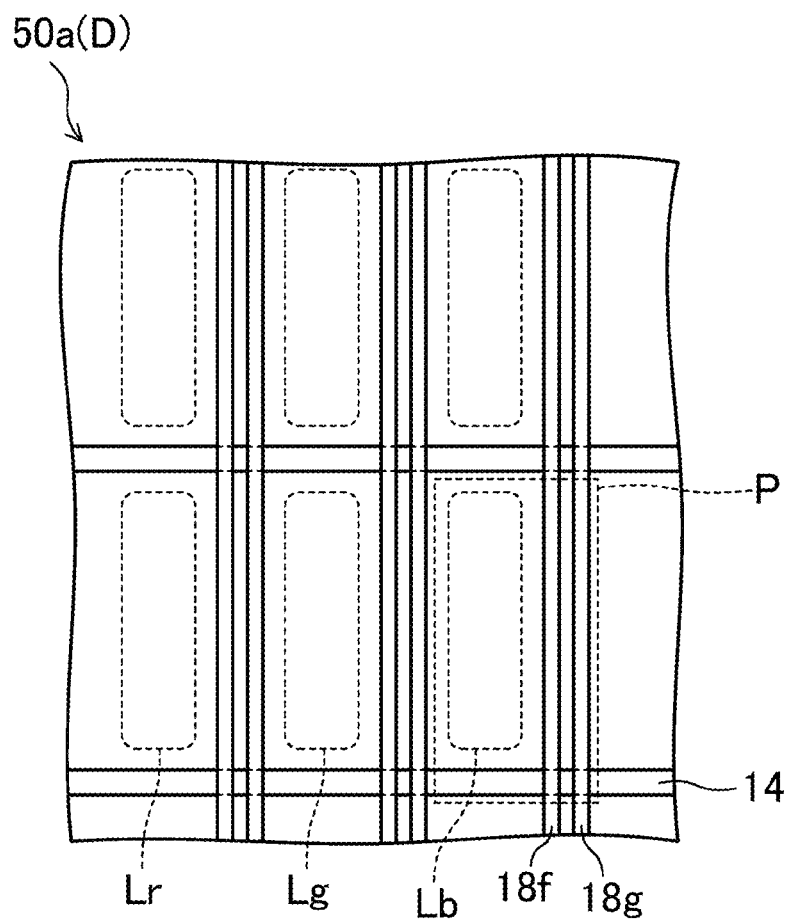
FIG. 2 is a plan view of a display region of the organic EL display device according to the first embodiment of the disclosure.
Figure 3:
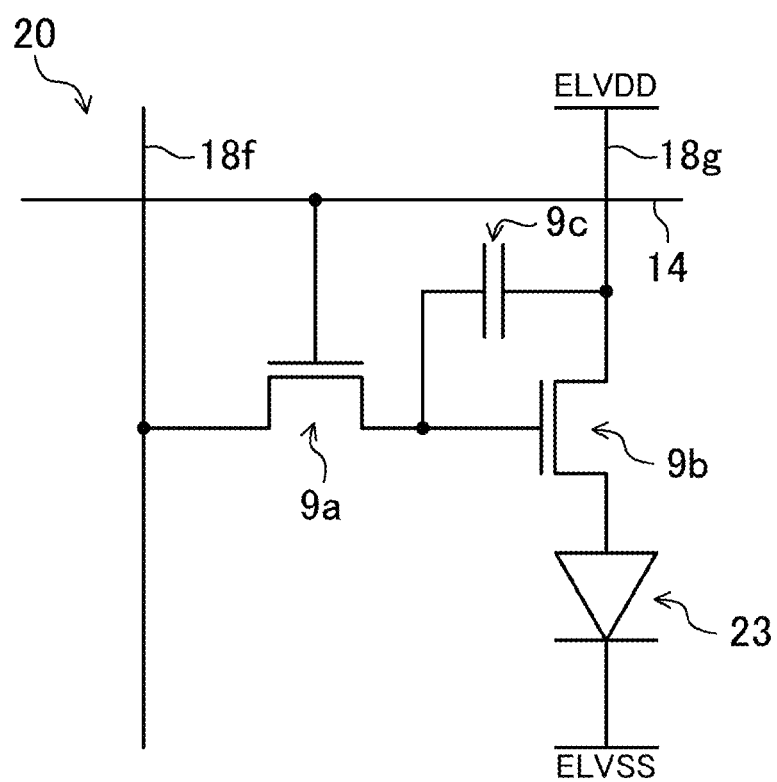
FIG. 3 is an equivalent circuit diagram illustrating a TFT layer making up the organic EL display device according to the first embodiment of the disclosure.
Figure 4:
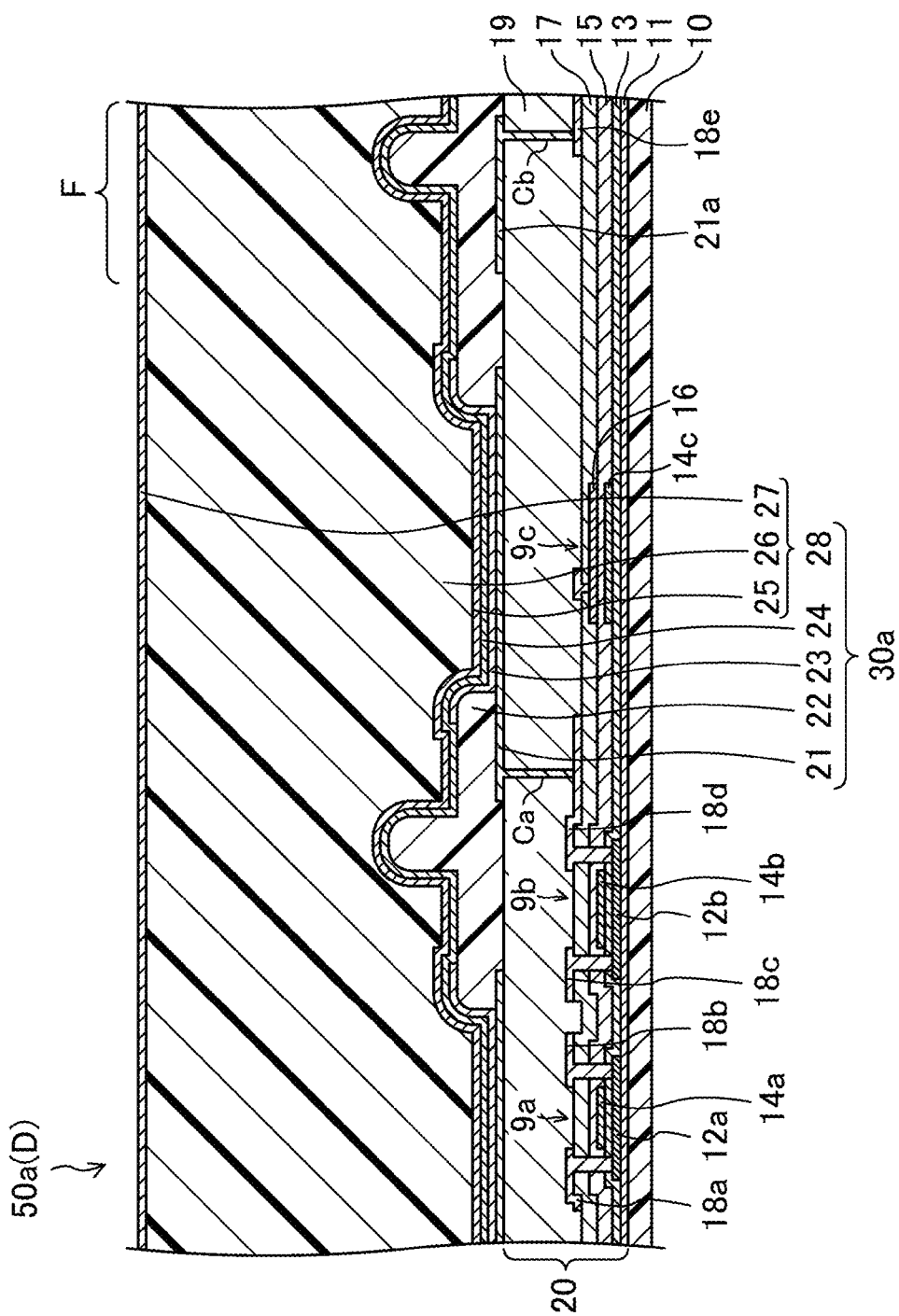
FIG. 4 is a cross-sectional view of the display region of the organic EL display device according to the first embodiment of the disclosure.
Figure 5:
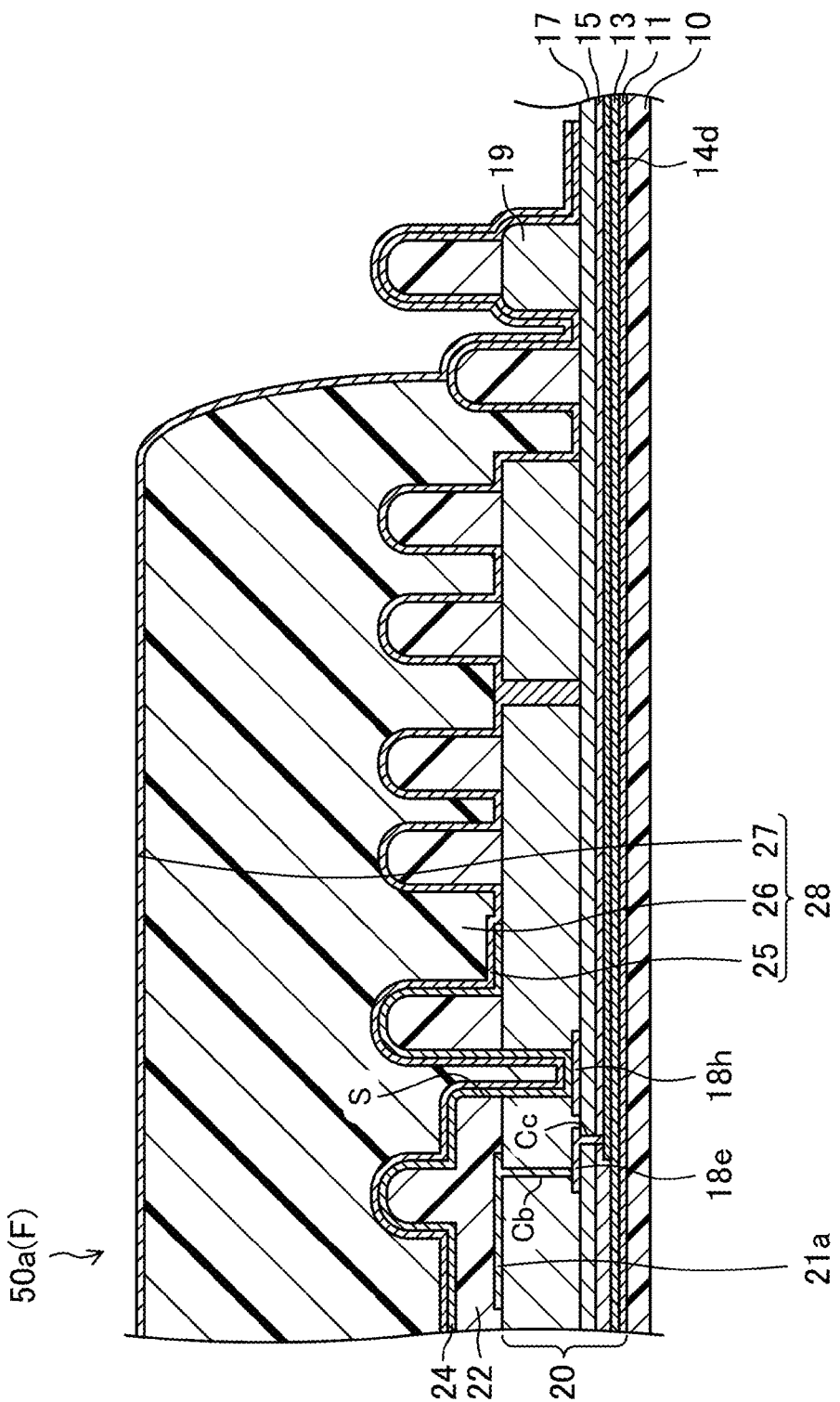
FIG. 5 is a cross-sectional view of a frame region of the organic EL display device according to the first embodiment of the disclosure.
Figure 6:
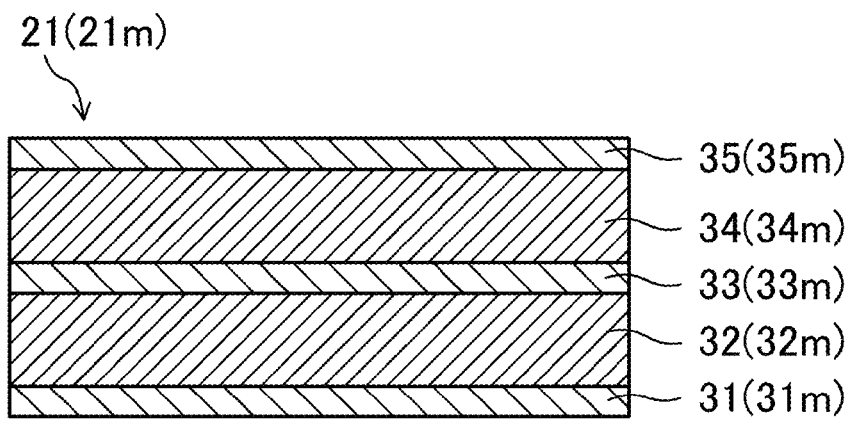
FIG. 6 is a cross-sectional view illustrating a first electrode making up the organic EL display device according to the first embodiment of the disclosure.
Figure 7:
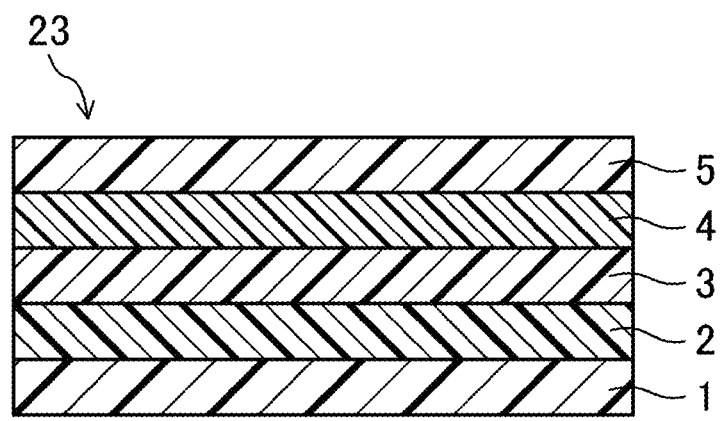
FIG. 7 is a cross-sectional view illustrating an organic EL layer making up the organic EL display device according to the first embodiment of the disclosure.

FIGS. 1 to 7 illustrate a first embodiment of a display device according the disclosure. In each of the following embodiments, an organic EL display device including an organic EL element will be described as a display device including a light emitting element. Here, FIG. 1 is a plan view of an organic EL display device 50a of an embodiment. FIG. 2 is a plan view of a display region D of the organic EL display device 50a. FIG. 3 is an equivalent circuit diagram illustrating a TFT layer 20 making up the organic EL display device 50a. FIG. 4 is a cross-sectional view of the display region D of the organic EL display device 50a. FIG. 5 is a cross-sectional view of a frame region F of the organic EL display device 50a. FIG. 6 is a cross-sectional view illustrating a first electrode 21 making up the organic EL display device 50a. FIG. 7 is a cross-sectional view illustrating an organic EL layer 23 making up the organic EL display device 50a.

As illustrated in FIG. 1, the organic EL display device 50a includes the display region D configured to display an image specified in a rectangular shape, and a frame region F defined to surround the display region D. Here, a plurality of subpixels P are disposed in a matrix configuration in the display region D of the organic EL display device 50a, as illustrated in FIG. 2. In the display region D of the organic EL display device 50a, a subpixel P including a red light emitting region Lr configured to execute a red gray scale display, a subpixel P including a green light emitting region Lg configured to execute a green gray scale display, and a subpixel P including a blue light emitting region Lb configured to execute a blue gray scale display are provided adjacent to one another. One pixel is made up of the three adjacent subpixels P including the red light emitting region Lr, the green light emitting region Lg, and the blue light emitting region Lb, respectively in the display region D of the organic EL display device 50a.

As illustrated in FIG. 4, the organic EL display device 50a includes a resin substrate layer 10 provided as a resin substrate and an organic EL element 30a provided on the resin substrate layer 10 via the thin film transistor (TFT) layer 20 and making up the display region D.

The resin substrate layer 10 is formed, for example, of polyimide resin or the like.

As illustrated in FIG. 4, the TFT layer 20 includes a base coating film 11 provided on the resin substrate layer 10, a plurality of first TFTs 9a, a plurality of second TFTs 9b, a plurality of capacitors 9c, in which the first TFTs 9a, the second TFTs 9b and the capacitors 9c are all provided on the base coating film 11, and a TFT flattening film 19 provided on each of the first TFTs 9a, each of the second TFTs 9b, and each of the capacitors 9c. Here, in the TFT layer 20, as illustrated in FIGS. 2 and 3, a plurality of gate lines 14 are provided extending parallel to each other in a horizontal direction in the figures. In the TFT layer 20, as illustrated in FIGS. 2 and 3, a plurality of source lines 18f are provided extending parallel to each other in a vertical direction in the figures. In the TFT layer 20, as illustrated in FIGS. 2 and 3, a plurality of power supply lines 18g are provided extending parallel to each other in the vertical direction in the figures while being disposed adjacent to the corresponding source lines 18f. In the TFT layer 20, as illustrated in FIG. 3, each subpixel P includes the first TFT 9a, the second TFT 9b, and the capacitor 9c.

The base coating film 11 is made up of a single-layer film or a layered film of an inorganic insulating film of, for example, silicon nitride, silicon oxide, silicon oxide nitride, or the like.

The first TFT 9a is connected to the corresponding gate line 14 and source line 18f in each subpixel P as illustrated in FIG. 3. As illustrated in FIG. 4, the first TFT 9a includes a semiconductor layer 12a provided in an island shape on the base coating film 11, a gate insulating film 13 provided covering the semiconductor layer 12a, a gate electrode 14a provided on the gate insulating film 13, overlapping part of the semiconductor layer 12a, a first interlayer insulating film 15 and a second interlayer insulating film 17 which are sequentially provided covering the gate electrode 14a, and a source electrode 18a and a drain electrode 18b which are provided on the second interlayer insulating film 17, disposed spaced apart from each other. The gate insulating film 13, the first interlayer insulating film 15, and the second interlayer insulating film 17 are made up of a single-layer film or a layered film of an inorganic insulating film of, for example, silicon nitride, silicon oxide, silicon oxide nitride, or the like.

The second TFT 9b is connected to the corresponding first TFT 9a and power supply line 18g in each subpixel P as illustrated in FIG. 3. As illustrated in FIG. 4, the second TFT 9b includes a semiconductor layer 12b provided in an island shape on the base coating film 11, the gate insulating film 13 provided covering the semiconductor layer 12b, a gate electrode 14b provided on the gate insulating film 13, overlapping part of the semiconductor layer 12b, the first interlayer insulating film 15 and the second interlayer insulating film 17 which are sequentially provided covering the gate electrode 14b, and a source electrode 18c and a drain electrode 18d which are provided on the second interlayer insulating film 17, disposed spaced apart from each other.

In the present embodiment, the first TFT 9a and the second TFT 9b are described as being of top-gate type; however, they may be of bottom-gate type TFT.

The capacitor 9c is connected to the corresponding first TFT 9a and power supply line 18g in each subpixel P as illustrated in FIG. 3. The capacitor 9c includes, as illustrated in FIG. 4, a lower conductive layer 14c formed of the same material and in the same layer as those of the gate electrode, the first interlayer insulating film 15 provided covering the lower conductive layer 14c, and an upper conductive layer 16 provided on the first interlayer insulating film 15, overlapping the lower conductive layer 14c.

The TFT flattening film 19 is formed, for example, of a colorless transparent organic resin material such as polyimide resin.

The organic EL element 30a includes, as illustrated in FIG. 4, a plurality of first electrodes 21, an edge cover 22, a plurality of organic EL layers 23, a second electrode 24, and a sealing film 28 which are provided sequentially in that order on the TFT flattening film 19.

As illustrated in FIG. 4, the plurality of first electrodes 21 are arranged in a matrix configuration over the TFT flattening film 19 as reflection electrodes, corresponding to the plurality of subpixels P.

As illustrated in FIG. 4, the first electrode 21 is connected to the drain electrode 18d of each second TFT 9b via a contact hole Ca formed in the TFT flattening film 19. The first electrode 21 functions to inject holes (positive holes) into the organic EL layer 23. The first electrode 21 is preferably formed of a material having a large work function to improve the efficiency of hole injection into the organic EL layer 23. As illustrated in FIG. 6, the first electrode 21 includes a first transparent conductive layer (a lower transparent conductive layer) 31, a first metallic conductive layer (a lowermost metallic conductive layer) 32, a second transparent conductive layer (an intermediate transparent conductive layer) 33, a second metallic conductive layer (an uppermost metallic conductive layer) 34, and a third transparent conductive layer (an upper transparent conductive layer) 35, which are provided sequentially on the TFT flattening film 19, and respective peripheral portions of those layers are aligned with one another.

The first transparent conductive layer 31, the second transparent conductive layer 33, and the third transparent conductive layer 35 are about 10 nm thick and are formed of an oxide-based transparent conductive material such as indium tin oxide (ITO) and indium zinc oxide (IZO).

The first metallic conductive layer 32 has a thickness ranging, for example, from 80 nm to 150 nm and is formed of a low resistance metallic material such as silver, a silver alloy, aluminum, an aluminum alloy, copper, or a copper alloy.

The second metallic conductive layer 34 has light reflectivity, has a thickness ranging, for example, from 80 nm to 150 nm, and is formed of a low resistance metallic material such as silver, a silver alloy, aluminum, or an aluminum alloy. Here, a total thickness of the first metallic conductive layer 32 and the second metallic conductive layer 34 is 150 nm or greater and 300 nm or smaller.

The first electrode 21 has a layered structure of an ITO layer (10 nm), a silver alloy layer (100 nm), an ITO layer (10 nm), a silver alloy layer (100 nm), and an ITO layer (10 nm), which are layered sequentially in that order, and when using a PAN-based aqueous solution containing phosphoric acid, acetic acid and nitric acid as an etchant, an inward shift amount of an end face of the silver alloy from an end face of the upper ITO layer is 2 μm or smaller. When the film thickness of the silver alloy layer exceeds 150 nm, there are fears that the inward shift amount of the end face of the silver alloy layer from the end face of the ITO layer exceeds 2 μm. In this description, the "end face of the ITO layer and that of the silver alloy layer are aligned with each other" means that the inward shift amount of the end face of the silver alloy layer from the end face of the ITO layer is 2 μm or smaller.

In the frame region, a first wiring line 21a is provided in the same layer and is formed of the same material as those of the first electrode 21 on the TFT flattening film 19, as illustrated in FIG. 4. As illustrated in FIGS. 4 and 5, the first wiring line 21a is provided such that it is covered by the edge cover 22, and is connected sequentially to a source conductive layer 18e and a gate conductive layer 14d on a side of the frame region F facing the display region D, and extends to a terminal portion T. The source conductive layer 18e is provided in the same layer and formed of the same material as those of the source electrodes 18a and 18c as well as those of the drain electrodes 18b and 18d, and is connected to the first wiring line 21a inward of a slit S in the edge cover 22 (on the side facing the display region D) via a contact hole Cb formed in the TFT flattening film 19 as illustrated in FIGS. 4 and 5. The gate conductive layer 14d is provided in the same layer and is formed of the same material as those of the gate electrodes 14a and 14b, and extends towards the frame region F to intersect the slit S, and is connected to the source conductive layer 18e via a contact hole Cc formed in the layered film of the first interlayer insulating film 15 and the second interlayer insulating film 17, as illustrated in FIG. 5. In this embodiment, while the first wiring line 21a is described as including the wiring line connection structure in which the first wiring line 21a is connected to the source conductive layer 18e and the gate conductive layer 14d, the first wiring line 21a may be connected to at least one conductive layer which is provided in the same layer and formed of the same material as those of the gate electrode 14a, the source electrode 18a, or the upper conductive layer 16. That is, the first wiring line 21a may be connected to a conductive layer which is provided in the same layer and is formed of the same material as those of any one of the metallic layers of the TFT layer 20.

As illustrated in FIG. 4, the edge cover 22 is provided in the form of a lattice, covering a peripheral portion of each first electrode 21. Materials making up the edge cover 22 may include organic films of, for example, polyimide resin, acrylic resin, polysiloxane resin, novolak resin, and the like. The edge cover 22 is provided in the form of a plurality of frames, surrounding the display region D as illustrated in FIG. 5 in the frame region F and functions as a blocking wall configured to suppress the expansion of an organic resin material (supplied by an ink jet method) forming an organic film 26 of the sealing film 28.

As illustrated in FIG. 4, the plurality of organic EL layers 23 are disposed individually on the first electrodes 21 and are each provided in a matrix configuration so as to correspond to the plurality of subpixels. As illustrated in FIG. 7, each of organic EL layers 23 includes a hole injection layer 1, a hole transport layer 2, a light emitting layer 3, an electron transport layer 4, and an electron injection layer 5, which are provided sequentially in that order over the first electrode 21.

The hole injection layer 1 is also referred to as an anode buffer layer, and functions to reduce an energy level difference between the first electrode 21 and the organic EL layer 23 to thereby improve the efficiency of hole injection into the organic EL layer 23 from the first electrode 21. Materials making up the hole injection layer 1 may include, for example, triazole derivative, oxadiazole derivative, imidazole derivative, polyarylalkane derivative, pyrazoline derivative, phenylenediamine derivative, oxazole derivative, styrylanthracene derivative, fluorenone derivative, hydrazone derivative, stilbene derivative, and the like.

The hole transport layer 2 functions to improve the efficiency of hole transport from the first electrode 21 to the organic EL layer 23. Materials making up the hole transport layer 2 may include, for example, porphyrin derivative, aromatic tertiary amine compound, styrylamine derivative, polyvinylcarbazole, poly-p-phenylenevinylene, polysilane, triazole derivative, oxadiazole derivative, imidazole derivative, polyarylalkane derivative, pyrazoline derivative, pyrazolone derivative, phenylenediamine derivative, arylamine derivative, amine-substituted chalcone derivative, oxazole derivative, styrylanthracene derivative, fluorenone derivative, hydrazone derivative, stilbene derivative, hydrogenated amorphous silicon, hydrogenated amorphous silicon carbide, zinc sulfide, zinc selenide, and the like.

The light emitting layer 3 is a region where holes and electrons are injected from the first electrode 21 and the second electrode 24, respectively, and recombine, when a voltage is applied via the first electrode 21 and the second electrode 24. The light emitting layer 3 is formed of a material having a high light emitting efficiency. Then, materials making up the light emitting layer 3 may include for example, metal oxinoid compound [8-hydroxyquinoline metal complex], naphthalene derivative, anthracene derivative, diphenyl ethylene derivative, vinyl acetone derivative, triphenylamine derivative, butadiene derivative, coumarin derivative, benzoxazole derivative, oxadiazole derivative, oxazole derivative, benzimidazole derivative, thiadiazole derivative, benzothiazole derivative, styryl derivative, styrylamine derivative, bisstyrylbenzene derivative, tris-styrylbenzene derivative, perylene derivative, perinone derivative, aminopyrene derivative, pyridine derivative, rhodamine derivative, aquidine derivative, phenoxazone, quinacridone derivative, rubrene, poly-p-phenylenevinylene, polysilane, and the like.

The electron transport layer 4 functions to facilitate migration of electrons to the light emitting layer 3 efficiently. Materials making up the electron transport layer 4 may include, for example, oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, metal oxinoid compound, and the like.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 may reduce the drive voltage of the organic EL element 30$a$ by this function. The electron injection layer 5 is also referred to as a cathode buffer layer. Materials making up the electron injection layer 5 may include, for example, inorganic alkaline compounds such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), strontium oxide (SrO), and the like.

As illustrated in FIG. 4, the second electrode 24 is provided as a common electrode, covering the organic EL layer 23 and the edge cover 22. As illustrated in FIG. 5, the second electrode 24 is connected to a source conductive layer 18$h$ which is provided in the same layer and is formed of the same material as those of the source electrodes 18$a$ and 18$c$ and the drain electrodes 18$b$ and 18$d$ via the slit S formed in the edge cover 22 and the TFT flattening film 19 in the frame region F, with the slit S surrounding almost a whole circumference of the display region D. The second electrode 24 functions to inject electrons into the organic EL layer 23. It is more preferable that the second electrode 24 is formed of a material having a small work function to improve the efficiency of electron injection into the organic EL layer 23. Materials making up the second electrode 24 may include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), or the like. The second electrode 24 may be formed of alloys of magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), lithium fluoride (LiF)/calcium (Ca)/aluminum (Al), and the like. The second electrode 24 may be formed of an electrically conductive oxide such as tin oxide (SnO), zinc oxide (ZnO), indium tin oxide (ITO), and indium zinc oxide (IZO). The second electrode 24 may include a stack of a plurality of layers of any of the materials described above. Materials having a small work function may include, for example, magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), and the like.

The sealing film 28 includes, as illustrated in FIG. 4, a first inorganic film 25 provided covering the second electrode 24, an organic film 26 provided covering the first inorganic film 25, and a second inorganic film 27 provided covering the organic film 26, and functions to protect the organic EL layer 23 from water and oxygen. The first inorganic film 25 and the second inorganic film 27 may be made up of, for example, an inorganic material such as silicon oxide ($SiO_2$) or aluminum oxide ($Al_2O_3$), silicon nitride (SiNx (x denoting a positive integer) such as trisilicon tetranitride ($Si_3N_4$), or silicon carbide nitride (SiCN). The organic film 26 is made up of, for example, an organic material such as acrylate, polyurea, parylene, polyimide, or polyamide.

The organic EL display device 50$a$ described above is configured such that, in each subpixel P, a gate signal is input into the first TFT 9$a$ via the gate line 14 to thereby turn on the first TFT 9$a$, a predetermined voltage corresponding to a source signal is written in the gate electrode 14$b$ of the second TFT 9$b$ and the capacitor 9$c$ via the source line 18$f$, the magnitude of current from the power supply line 18$g$ is specified based on a gate voltage of the second TFT 9$b$, and the specified current is supplied to the organic EL layer 23, whereby the light emitting layer 3 of the organic EL layer 23 emits light to display an image. In the organic EL display 50$a$, since even when the first TFT 9$a$ is turned off, the gate voltage of the second TFT 9$b$ is held by the capacitor 9$c$, the light emitting layer 3 keeps emitting light until a gate signal of the next frame is input.

The organic EL display device 50$a$ of this embodiment may be manufactured, for example, by forming the TFT layer 20 and the organic EL element 30$a$ on the front surface of the resin substrate layer 10 formed on the glass substrate by use of a known method, and then peeling the glass substrate from the resin substrate layer 10. Here, when forming the first electrode 21 on the TFT layer 20, a first transparent conductive film 31$m$, a first metallic conductive film 32$m$, a second transparent conductive film 33$m$, a second metallic conductive film 34$m$, and a third transparent conductive film 35$m$ are formed on the TFT layer 20 to form a conductive film layered body 21$m$ (refer to FIG. 6), and thereafter, a wet etching is executed on the whole of the conductive film layered body 21$m$ using the PAN-based aqueous solution containing phosphoric acid, acetic acid, and nitric acid to thereby form the first transparent conductive layer 31, the first metallic conductive layer 32, the second transparent conductive layer 33, the second metallic conductive layer 34, and the third transparent conductive layer 35, which make up the first electrode 21.

Thus, as has been described heretofore, according to the organic EL display device 50$a$ of this embodiment, the first electrode 21 provided on the TFT flattening film 19 as the reflection electrode includes the oxide-based first transparent conductive layer 31, the first metallic conductive layer 32, the oxide-based second transparent conductive layer 33, the second metallic conductive layer 34 having the light reflectivity, and the oxide-based third transparent conductive layer 35. Due to this, when forming the first electrode 21 through wet etching, a battery effect is generated where an etching speed at which transparent conductive films making up the first transparent conductive layer 31, the second transparent conductive layer 33, and the third transparent conductive layer 35 are etched becomes almost equal to an etching speed at which metallic conductive films making up the first metallic conductive layer 32 and the second metallic conductive layer 34 are etched as a result of electrons being given and received between the transparent conductive films and the metallic conductive films. By adopting this configuration, even though the first metallic conductive layer 32 and the second metallic conductive layer 34 are made thick, the end faces of the first metallic conductive layer 32 and the second metallic conductive layer 34 of the intermediate layer may be prevented from shifting inward from the end faces of the first transparent conductive layer 31, the second transparent conductive layer 33, and the third transparent conductive layer 35. Consequently, with the organic EL display device 50a, the first wiring line 21a, having the low resistance and in which the inward shift of the end faces of the first metallic conductive layer 32 and the second metallic conductive layer 34 is prevented, may be formed of the material of which the first electrode 21 is formed.

Second Embodiment

Figure 8:
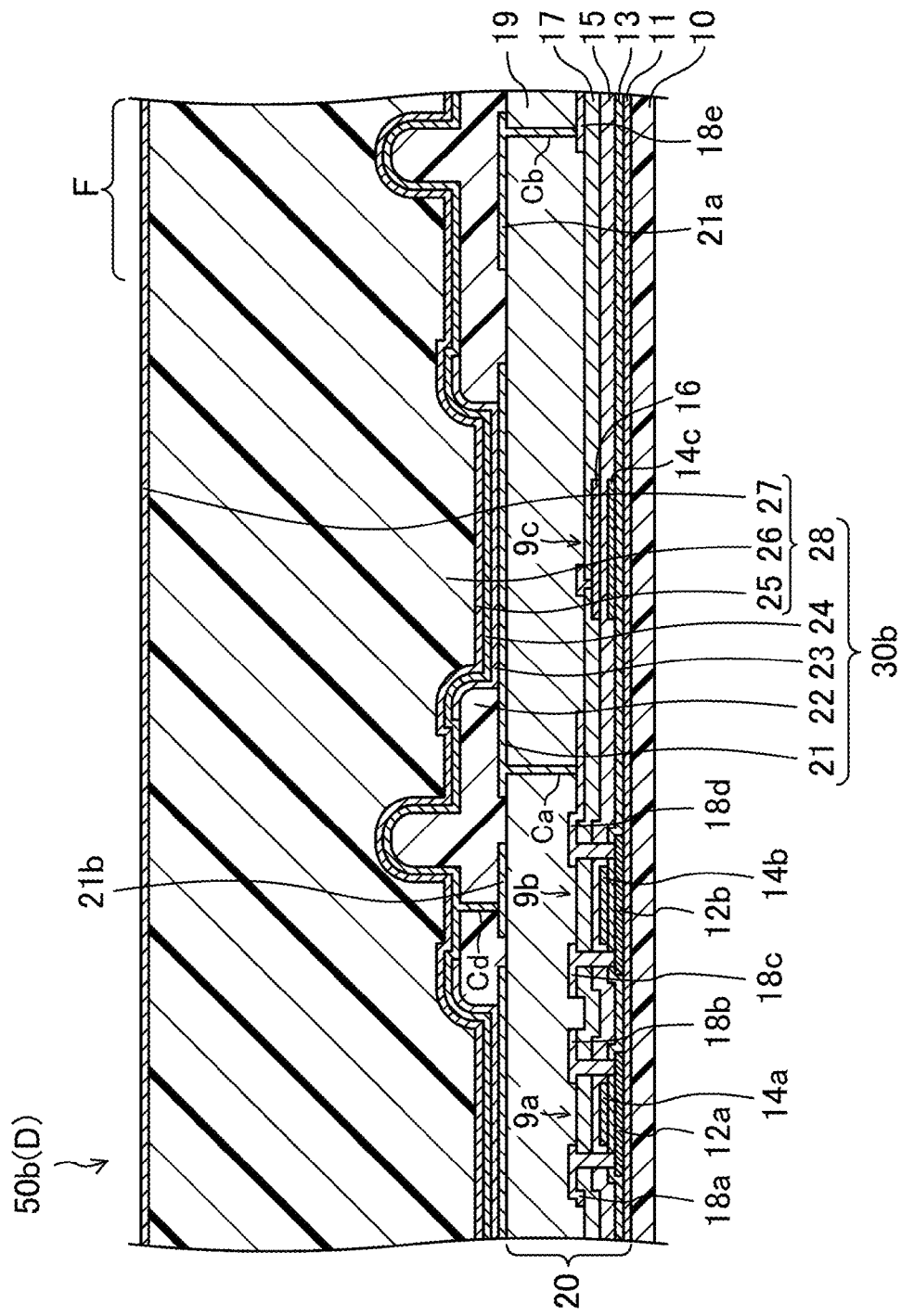
FIG. 8 is a cross-sectional view of a display region of an organic EL display device according to a second embodiment of the disclosure.

FIG. 8 illustrates a second embodiment of a display device according the disclosure. FIG. 8 is a cross-sectional view of a display region D of an organic EL display device 50b of this embodiment. In the following embodiment, the same reference signs will be given to the same portions as those illustrated in FIGS. 1 to 7, so that a detailed description thereof will be omitted.

While the first embodiment illustrates the organic EL display device 50a in which the first electrode 21 and the first wiring line 21 are provided on the TFT layer 20, the present embodiment illustrates the organic EL display device 50b in which a first electrode 21, a first wiring line 21a, and a second wiring line 21b are provided on a TFT layer 20.

The organic EL display device 50b includes a display region D configured to display an image specified in a rectangular shape and a frame region F defined to surround the display region D. As illustrated in FIG. 8, the organic EL display device 50b includes a resin substrate layer 10 and an organic EL layer 30b provided on the resin substrate layer 10 via the TFT layer 20 and making up the display region D.

The organic EL element 30b includes, as illustrated in FIG. 8, a plurality of first electrodes 21, an edge cover 22b, a plurality of organic EL layers 23, a second electrode 24, and a sealing film 28, which are provided sequentially in that order on a TFT flattening film 19.

As illustrated in FIG. 8, the second wiring line 21b is provided in the same layer and is formed of the same material as those of the first electrode on the TFT flattening film 19. As illustrated in FIG. 8, the second wiring line 21b is covered by the edge cover 22 and is connected to the second electrode 24 via a contact hole Cd formed in the edge cover 22 to thereby reduce the resistance of the second electrode 24.

In the present embodiment, while the second wiring line 21b is illustrated as being electrically connected to the second electrode 24, the second wiring line 21b may be electrically connected to a high-level power supply line 18g (ELVDD, refer to FIG. 3) to reduce the resistance of the high-level power supply line 18g.

As with the organic EL display device 50a of the first embodiment, the organic EL display device 50b described above is flexible and displays an image by causing a light emitting layer 3 of the organic EL layer 23 to emit light as required via the first TFT 9a and the second TFT 9b in each subpixel P.

Thus, as has been described heretofore, according to the organic EL display device 50a of this embodiment, the first electrode 21 provided on the TFT flattening film 19 as the reflection electrode includes the oxide-based first transparent conductive layer 31, the first metallic conductive layer 32, an oxide-based second transparent conductive layer 33, the second metallic conductive layer 34 having light reflectivity, and an oxide-based third transparent conductive layer 35. Due to this, when forming the first electrode 21 through wet etching, a battery effect is generated where an etching speed at which transparent conductive films making up the first transparent conductive layer 31, the second transparent conductive layer 33, and the third transparent conductive layer 35 are etched becomes almost equal to an etching speed at which metallic conductive films making up the first metallic conductive layer 32 and the second metallic conductive layer 34 are etched as a result of electrons being given and received between the transparent conductive films and the metallic conductive films. By adopting this configuration, even though the first metallic conductive layer 32 and the second metallic conductive layer 35 are made thick, the end faces of the first metallic conductive layer 32 and the second metallic conductive layer 34 of the intermediate layer may be prevented from shifting inward from the end faces of the first transparent conductive layer 31, the second transparent conductive layer 33, and the third transparent conductive layer 35. Consequently, with the organic EL display device 50b, the first wiring line 21a, having the low resistance and in which the inward shift of the end faces of the first metallic conductive layer 32 and the second metallic conductive layer 34 is prevented, may be formed of the material of which the first electrode 21 is formed.

Additionally, according to the organic EL display device 50b of the present embodiment, since the second wiring line 21b, which is provided in the same layer and is formed of the same material of those of the first electrode 21 and which has the low resistance, is connected to the second electrode 24, the resistance of the second electrode 24 may be reduced.

Third Embodiment

Figure 9:
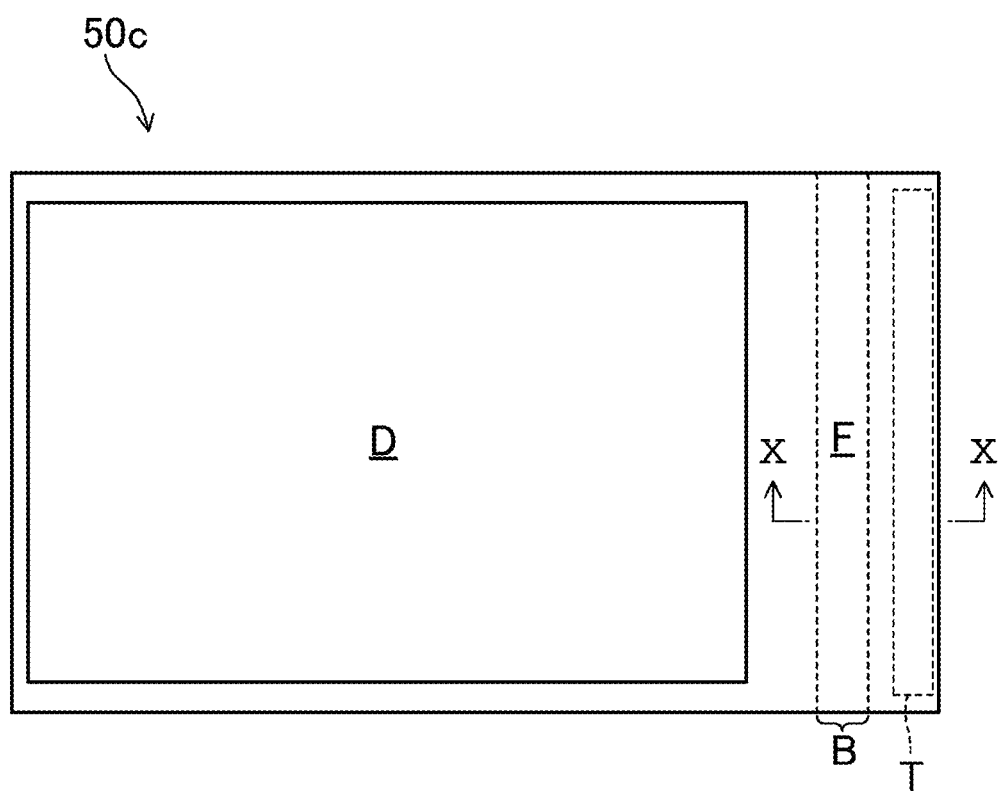
FIG. 9 is a plan view of an organic EL display device according to a third embodiment of the disclosure.
Figure 10:
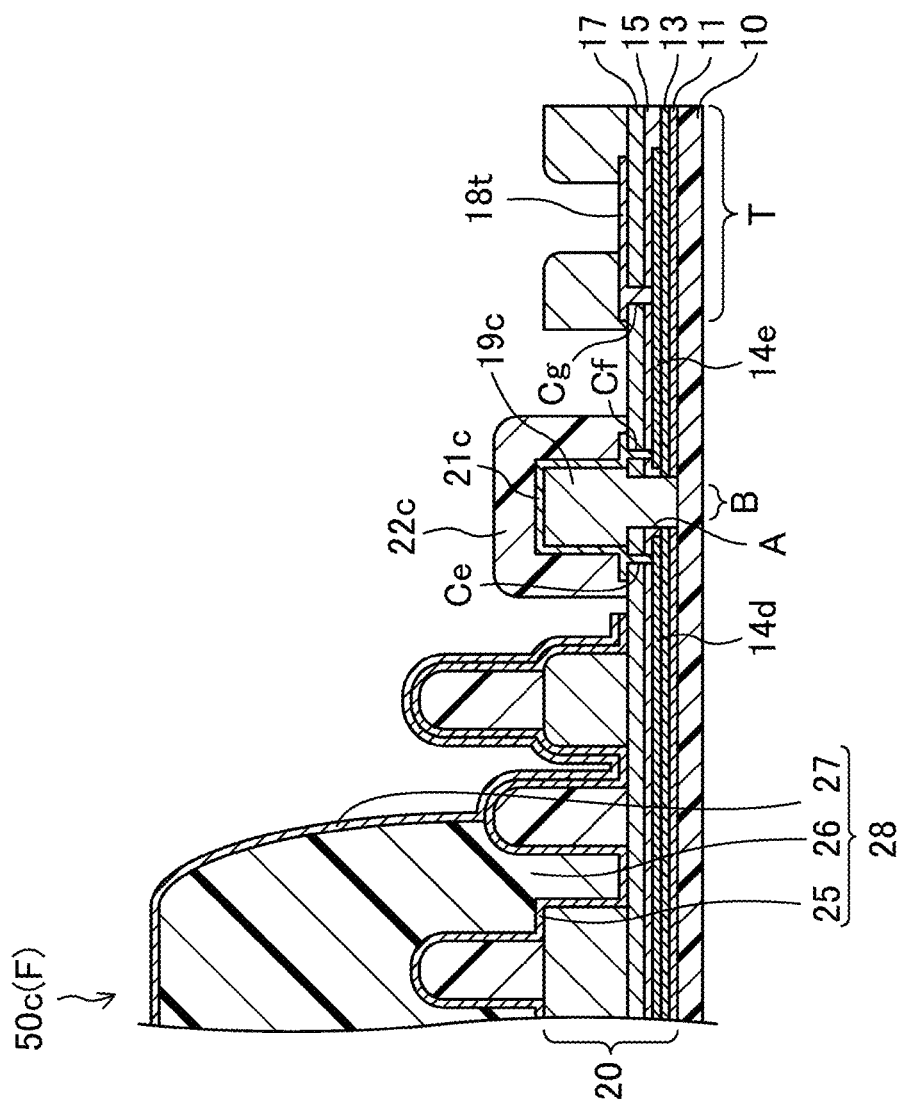
FIG. 10 is a cross-sectional view of a frame region of the organic EL display device taken along a line X-X of FIG. 9.

FIGS. 9 and 10 illustrate a third embodiment of a display device according the disclosure. FIG. 9 is a plan view of an organic EL display device 50c of the present embodiment. FIG. 10 is a cross-sectional view of a frame region F of the organic EL display device 50c taken along a line X-X in FIG. 9.

While the first and second embodiments illustrate the organic EL display device 50a and the organic EL display device 50b, respectively, in which no consideration is taken in relation to bending in the frame region F, the present embodiment illustrates the organic EL display device 50c including a bending portion B provided in the frame region F.

As illustrated in FIG. 9, the organic EL display device 50c includes a display region D configured to display an image specified in a rectangular shape, a frame region F defined to surround the display region D, a terminal portion T provided at an end portion of the frame region F, and a bending portion B provided between the display region D and the terminal portion T. Here, as illustrated in FIG. 9, the bending portion B is provided following one side (a right side in the figure) of the display region D such that the bending portion B may be bent 180 degrees (into a U shape) about a vertical direction in the figure as a bending axis.

The display region D of the organic EL display device 50c has the same configuration as that of the organic EL device 50a of the first embodiment described above or that of the organic EL display device 50b of the second embodiment described above.

As illustrated in FIG. 10, the organic EL display device 50c includes, in the frame region F, the resin substrate layer 10, an inorganic layered film of a base coating film 11, a gate insulating film 13, a first interlayer insulating film 15, and a second interlayer insulating film 17, which are provided sequentially on the resin substrate layer 10, a frame flattening film 19c provided to fill in an opening portion A formed in the inorganic layered film, a third wiring line 21c provided on the frame flattening film 19c, and a resin film 22c provided covering the third wiring line 21c. Here, in the bending portion B, the opening portion A is formed penetrating the inorganic layered film of the base coating film 11, the gate insulating film 13, the first interlayer insulating film 15, and the second interlayer insulating film 17 to thereby expose an upper surface of the resin substrate layer 10.

The frame flattening film 19c is provided in the same layer and is formed of the same material as those of a TFT flattening film 19.

The third wiring line 21c is provided in the same layer and is formed of the same material as those of the first electrode 21. As illustrated in FIG. 10, one end portion of the third wiring line 21c is connected to a gate conductive layer 14d via a contact hole Ce formed in a layered film of the first interlayer insulating film 15 and the second interlayer insulating film 17. The other end portion of the third wiring line 21c is connected to a gate conductive layer 14e via a contact hole Cf formed in the layered film of the first interlayer insulating film 15 and the second interlayer insulating film 17, as illustrated in FIG. 10. The gate conductive layer 14e is provided in the same layer and is formed of the same material as those of the gate electrodes 14a and 14b and is connected to a source conductive layer (a wiring line terminal) 18t of the end portion T via a contact hole Cg formed in the layered film of the first interlayer insulating film 15 and the second interlayer insulating film 17, as illustrated in FIG. 10.

A resin film 22c is provided in the same layer and is formed of the same material as those of an edge cover 22.

As with the organic EL display device 50a of the first embodiment, the organic EL display device 50c described above is flexible and displays an image by causing a light emitting layer 3 of the organic EL layer 23 to emit light as required via the first TFT 9a and the second TFT 9b in each subpixel P.

Thus, as has been described heretofore, according to the organic EL display device 50c of this embodiment, the first electrode 21 provided on the TFT flattening film 19 as the reflection electrode includes the oxide-based first transparent conductive layer 31, the first metallic conductive layer 32, the oxide-based second transparent conductive layer 33, the second metallic conductive layer 34 having light reflectivity, and the oxide-based third transparent conductive layer 35. Due to this, when forming the first electrode 21 through wet etching, a battery effect is generated where an etching speed at which transparent conductive films making up the first transparent conductive layer 31, the second transparent conductive layer 33, and the third transparent conductive layer 35 are etched becomes almost equal to an etching speed at which metallic conductive films making up the first metallic conductive layer 32 and the second metallic conductive layer 34 are etched as a result of electrons being given and received between the transparent conductive films and the metallic conductive films. By adopting this configuration, even though the first metallic conductive layer 32 and the second metallic conductive layer 34 are made thick, the end faces of the first metallic conductive layer 32 and the second metallic conductive layer 34 of the intermediate layer may be prevented from shifting inward from the end faces of the first transparent conductive layer 31, the second transparent conductive layer 33, and the third transparent conductive layer 35. Consequently, with the organic EL display device 50c, the first wiring line 21a, having a low resistance and in which the inward shift of end faces of the first metallic conductive layer 32 and the second metallic conductive layer 34 is prevented, may be formed of the material of which the first electrode 21 is formed.

According to the organic EL display devices 50c of this embodiment, since the opening portion A is formed in the inorganic layered film including the base coating film 11, the gate insulating film 13, the first interlayer insulating film 15, and the second interlayer insulating film 17 at the bending portion B of the frame region F, the occurrence of a film fracture of the inorganic layered film and a disconnection of the first wiring line 21c may be suppressed.

Other Embodiments

In the embodiments that have been described heretofore, while the organic EL display device is described including the two layers of the first metallic conductive layer and the second metallic conductive layer as the plurality of metallic conductive layers, the disclosure may also be applied to an organic EL display device including a plurality of metallic conductive layers of three layers or more.

In the embodiments described above, while the organic EL layer of the five-layer structure including the hole injection layer, the hole transport layer, the light emitting layer, the electron transport layer, and the electron injection layer is described as presenting the example, the organic EL layer may include a three-layer structure including a hole injection-cum-transport layer, a light emitting layer, and an electron transport-cum-injection layer.

In the embodiments described above, while the organic EL display devices are described as including the first electrode as an anode and the second electrode as a cathode, the disclosure may also be applicable to an organic EL display device in which the layer stacking structure of the organic EL is reversed in such a way that the first electrode constitutes a cathode and the second electrode constitutes an anode.

In the embodiments described above, while the organic EL display device is described as using the electrode of the TFT connected to the first electrode as the drain electrode, the disclosure may also be applied to an organic EL display device in which an electrode of a TFT connected to a first electrode is referred to as a source electrode.

In the embodiments, while the organic EL display device is described as being used as a display device, the disclosure may also be applied to, for example, a display device including quantum dot light emitting diodes (QLEDs), which are a light emitting element using a quantum dot-containing layer.

INDUSTRIAL APPLICABILITY

As has been described heretofore, the disclosure is useful for flexible display devices.

REFERENCE SIGNS LIST

A Opening portion
B Bending portion
D Display region
F Frame region
S Slit
T Terminal portion
10 Resin substrate layer (base substrate, resin substrate)
11 Base coating film (inorganic insulating film)
13 Gate insulating film (inorganic insulating film)
15 First interlayer insulating film (inorganic insulating film)

17 Second interlayer insulating film (inorganic insulating film)
14a, 14b Gate electrode (metallic layer)
14d, 14e Gate conductive layer
18a, 18c Source electrode (metallic layer)
18e Source conductive layer (first conductive layer)
18h Source conductive layer (second conductive layer)
18g Power supply line
19 TFT flattening film
19c Frame flattening film
20 TFT layer
21 First electrode (reflection electrode)
21a First wiring line
21b Second wiring line
21c Third wiring line
21m Conductive film layered body
22 Edge cover
22c Resin film
24 Second electrode (common electrode)
30a, 30b Organic EL element (light emitting element)
31 First transparent conductive layer (lower transparent conductive layer)
31m First transparent conductive film
32 First metallic conductive layer (lowermost metallic conductive layer)
32m First metallic conductive film
33 Second transparent conductive layer (intermediate transparent conductive layer)
33m Second transparent conductive film
34 Second metallic conductive layer (uppermost metallic conductive layer)
34m Second metallic conductive film
35 Third transparent conductive layer (upper transparent conductive layer)
35m Third transparent conductive film
50a to 50c Organic EL display device

The invention claimed is:

1. A display device comprising:
a base substrate;
a thin-film transistor (TFT) layer including, in order, a base coat film, a TFT, and a TFT flattening film, the TFT layer being provided on the base substrate;
a light emitting element provided on the TFT layer and including a stack of, in sequence, a reflection electrode, a light emitting layer, and a common electrode;
a display region including the light emitting element;
a frame region surrounding the display region;
a terminal portion at an end portion of the frame region; and
an edge cover covering a peripheral portion of the reflection electrode; wherein
the reflection electrode includes a plurality of metallic conductive layers made of a low resistance metallic material, an oxide-based lower transparent conductive layer provided on a lower surface side of a lowermost metallic conductive layer constituting a lowermost layer of the plurality of metallic conductive layers, an oxide-based upper transparent conductive layer provided on an upper surface side of an uppermost metallic conductive layer constituting an uppermost layer of the plurality of metallic conductive layers, and an oxide-based intermediate transparent conductive layer provided between the plurality of metallic conductive layers,
the uppermost metallic conductive layer has light reflectivity,
a first wiring line is provided on the TFT layer, the first wiring line being made of a same material as the reflection electrode,
the plurality of metallic conductive layers, the oxide-based lower transparent conductive layer, the oxide-based upper transparent conductive layer, and the oxide-based intermediate transparent conductive layer of the reflection electrode are aligned with one another at end portions thereof,
the first wiring line is electrically connected to a first conductive layer in the frame region and extends to the terminal portion,
the edge cover and the TFT flattening film include a slit which penetrates through both the edge cover and the TFT flattening film in the frame region, and
the first conductive layer and the first wiring line are electrically connected at a location closer to the display region than the slit is.

2. The display device according to claim 1, wherein the plurality of metallic conductive layers are a pair of metallic conductive layers, and
the uppermost metallic conductive layer of one of the pair of metallic conductive layers is formed of silver, a silver alloy, aluminum, or an aluminum alloy.

3. The display device according to claim 2, wherein the lowermost metallic conductive layer of the other of the pair of metallic conductive layers is formed of silver, a silver alloy, aluminum, an aluminum alloy, copper, or a copper alloy.

4. The display device according to claim 1, wherein the lower transparent conductive layer, the upper transparent conductive layer, and the intermediate transparent conductive layer are formed of indium tin oxide or indium zinc oxide.

5. The display device according to claim 1, wherein a film thickness of each of the metallic conductive layers is 150 nm or smaller.

6. The display device according to claim 1, wherein a total film thickness of the metallic conductive layers is 150 nm or greater and 300 nm or smaller.

7. The display device according to claim 1, wherein the light emitting element includes the edge cover, and the first wiring line is covered by the edge cover.

8. The display device according to claim 7, wherein the TFT layer includes a metallic layer, and
the first conductive layer is provided in a same layer and is made of a same material as the metallic layer in the frame region.

9. The display device according to claim 8, further comprising:
a gate conductive layer, wherein
a second conductive layer is provided in the same layer and is made of the same material as the metallic layer in the frame region,
the common electrode is electrically connected to the second conductive layer via the slit,
the first conductive layer is electrically connected to the gate conductive layer, and
the gate conductive layer extends to the frame region to intersect the slit.

10. The display device according to claim 7, wherein the TFT layer includes a source electrode,
a third wiring line made of a same material as the reflection electrode is provided on the TFT layer, and
the third wiring line is electrically connected to a high-level power supply line provided in a same layer and made of a same material as the source electrode.

11. The display device according to claim 7, wherein
the base substrate is a resin substrate,
a display region where the light emitting element is provided, a frame region provided on a circumference of the display region, a terminal portion provided in an end portion of the frame region, and a bend portion provided between the terminal portion and the display region are defined on the base substrate,
the bend portion includes an opening portion in at least one layer of an inorganic insulating film making up the TFT layer, the opening portion penetrating the inorganic insulating film to expose an upper surface of the resin substrate, a frame flattening film is provided filling in the opening portion, and a fourth wiring line made of a same material as the reflection electrode is provided on the frame flattening film,
the TFT layer includes a TFT flattening film, and
the frame flattening film is provided in a same layer and is made of a same material as the TFT flattening film.

12. The display device according to claim 11, wherein the fourth wiring line is covered by a resin film provided in a same layer and made of a same material as the edge cover.

13. The display device according to claim 1, wherein the light emitting element comprises an organic EL element.

14. A method for manufacturing the display device according to claim 1, the method comprising:

forming a conductive film layered body on the TFT layer by forming a plurality of transparent conductive films and a plurality of metallic conductive films such that one metallic conductive film of the plurality of metallic conductive films is disposed between a pair of adjacent transparent conductive films of the plurality of transparent conductive films; and after forming the conductive film layered body, forming the plurality of metallic conductive layers, a lower transparent conductive layer, an upper transparent conductive layer, and an intermediate transparent conductive layer by executing a wet etching on the conductive film layered body using an aqueous solution containing phosphoric acid, acetic acid, and nitric acid.

15. The method for manufacturing the display device according to claim 14, wherein a thickness of each of the metallic conductive films is 150 nm or smaller.

16. The method for manufacturing the display device according to claim 15, wherein a thickness of each of the plurality of metallic conductive layers is 80 nm or greater.

17. The display device according to claim 1, wherein a thickness of each of the plurality of metallic conductive layers is 80 nm or greater.

* * * * *